US006304517B1

(12) United States Patent
Ledfelt et al.

(10) Patent No.: US 6,304,517 B1
(45) Date of Patent: Oct. 16, 2001

(54) METHOD AND APPARATUS FOR REAL TIME CLOCK FREQUENCY ERROR CORRECTION

(75) Inventors: Rolf Erik Ledfelt, Malmö; Anders Wilhelm Östsjö, Bjärred, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/335,512

(22) Filed: Jun. 18, 1999

(51) Int. Cl.[7] .............................. G04B 47/00; G04G 3/02; H03B 27/00
(52) U.S. Cl. .............................. 368/10; 368/200; 331/47; 331/177 R
(58) Field of Search .................................... 368/156–157, 368/200–202; 331/46, 47, 116, 176; 395/555

(56) References Cited

U.S. PATENT DOCUMENTS

| | | |
|---|---|---|
| 4,074,514 | 2/1978 | Vaucher . |
| 4,110,791 * | 8/1978 | Medwin . |
| 4,282,595 | 8/1981 | Lowdenslager et al. ............ 455/231 |
| 4,325,036 * | 4/1982 | Kuwabara .......................... 531/176 |
| 4,448,543 * | 5/1984 | Vail .................................... 365/202 |
| 4,456,386 * | 6/1984 | Dellea ................................ 368/201 |
| 4,513,259 * | 4/1985 | Frerking ............................. 331/176 |
| 4,646,035 | 2/1987 | Chapelle ............................ 331/177 |
| 4,903,251 | 2/1990 | Chapman ........................... 368/156 |
| 4,949,055 | 8/1990 | Leitl ................................... 331/158 |
| 5,204,975 | 4/1993 | Shigemori .......................... 455/231 |
| 5,305,453 | 4/1994 | Boudry et al. .................... 395/550 |
| 5,327,404 * | 7/1994 | Hogan ................................ 368/201 |
| 5,473,284 | 12/1995 | Jantii et al. ......................... 331/10 |
| 5,481,507 | 1/1996 | Suzuki et al. ..................... 362/202 |
| 5,546,363 * | 8/1996 | Funaki et al. ..................... 368/600 |
| 5,717,661 | 2/1998 | Poulson ............................. 362/202 |
| 5,719,827 * | 2/1998 | Diep et al. .......................... 368/47 |
| 5,748,570 * | 5/1998 | Komoda et al. ................... 368/292 |
| 5,767,747 * | 6/1998 | Pricer ................................ 331/146 |
| 5,831,485 * | 11/1998 | Nelson et al. ....................... 331/47 |

FOREIGN PATENT DOCUMENTS

| | | |
|---|---|---|
| 0 052 884 | 6/1982 | (EP) . |
| 0 511 573 A2 | 11/1992 | (EP) . |
| 0 568 256 | 3/1994 | (EP) . |
| 0 683 443 A2 | 11/1995 | (EP) . |
| 0 768 583 A2 | 4/1997 | (EP) . |
| 0 851 593 | 7/1998 | (EP) . |
| 2 064 248 A | 6/1981 | (GB) . |
| 7-046039 | 7/1993 | (JP) . |
| 8-237030 | 2/1995 | (JP) . |
| 8-265044 | 3/1995 | (JP) . |
| 8-070218 | 3/1996 | (JP) . |
| WO 95/11456 | 4/1995 | (WO) . |
| WO 96/37959 | 11/1996 | (WO) . |
| WO 97/04366 | 2/1997 | (WO) . |
| 00/79349 | 12/2000 | (WO) . |

* cited by examiner

Primary Examiner—Vit Miska
(74) Attorney, Agent, or Firm—Burns, Doane, Swecker & Mathis, L.L.P.

(57) ABSTRACT

A real time clock, suitable for use in mobile units in a radiocommunication system, is calibrated during production, and corrects for timing inaccuracies during normal operation. As a result, the accuracy of the real time clock's crystal oscillator is increased economically and efficiently. Frequency error correction is performed by periodically adjusting the frequency of the real time clock by a fixed amount once for every interval of time defined by an adjustment value. The adjustment value is determined by a calibration procedure performed during manufacture of the mobile unit.

39 Claims, 6 Drawing Sheets

METHOD AND APPARATUS FOR REAL TIME CLOCK FREQUENCY ERROR CORRECTION

BACKGROUND

The present invention generally relates to frequency error correction within radiocommunication systems and more particularly to correction of fixed errors arising in crystal oscillators that are used as a timing reference in remote units of radiocommunication systems.

A block diagram of an exemplary cellular mobile radiotelephone system, including an exemplary base station 110 and mobile station 120, is illustrated in FIG. 1. The base station includes a control and processing unit 130 which is connected to the MSC 140 which in turn is connected to the PSTN (not shown). General aspects of such cellular radiotelephone systems are known in the art, as described by U.S. Pat. No. 5,175,867 to Wejke et al. "Neighbor-Assisted Handoff in a Cellular Communications System," which is incorporated herein by reference.

The base station 110 handles a plurality of voice or data channels through a data channel transceiver 150, which is controlled by the control and processing unit 130. Also each base station includes a control channel receiver 160 which may be capable of handling more than one control channel. The control channel transceiver 160 is controlled by the control and processing unit 130. The control channel transceiver 160 broadcasts control information over the control channel of the base station or cell to mobiles locked to that control channel.

The mobile station 120 receives the information broadcast on a channel at its data and control channel transceiver 170. Then the processing unit 180 evaluates the received control channel information, which includes the characteristics of the cells that are candidates for the mobile station to lock onto, and determines on which cell the mobile should lock. Advantageously, the received control channel information not only includes absolute information concerning the cell with which it is associated, but also contains relative information concerning other cells proximate to the cell associated with the control channel.

In a time division multiple access (TDMA) cellular radiotelephone, each radio channel is divided into a series of time slots. Each slot contains a burst of information (e.g., a digitally encoded portion of a voice conversation) from a data source such as a base station. The time slots are grouped into successive TDMA frames each having a predetermined duration. The number of time slots in each TDMA frame is related to the number of different users that can simultaneously share the radio channel. If each slot in a TDMA frame is assigned to a different user, the duration of a TDMA frame is the minimum amount of time between successive time slots assigned to the same user.

TDMA cellular systems operate in a buffer-and-burst, or discontinuous-transmission mode where each mobile station transmits (and receives) only during its assigned time slots. For example, an actively connected mobile station might transmit during slot 1, receive during slot 2, be idle during slot 3, transmit during slot 4, receive during slot 5, and be idle during slot 6, and then repeat the cycle during succeeding TDMA frames. Accordingly, a mobile unit's timing during use is vital to efficient signal transmission.

Clocking devices currently employed within mobile stations are not as accurate as they need to be. There are two different types of errors which are attributed to inaccurate clocking within mobile stations. First, errors known as "fixed errors" are introduced to a crystal oscillator during manufacture, and give rise to a fixed deviation from a preset frequency of the crystal oscillator. Additionally, the fixed error of the crystal oscillator can by further augmented by other fixed errors introduced into system timing by individual components connected to the crystal oscillator.

Dynamic errors, caused by temperature variations in the environment in which the mobile telephone is located, are also introduced into crystal oscillators. Crystal oscillators inherently depend upon the temperature of the environment. The frequency of a crystal oscillator tends to increase or decrease from its preset frequency depending upon the specifications on the crystal. Also, as the crystal ages, the frequency at a given temperature decreases. The frequency of the crystal oscillator can also vary dynamically due to the amount of voltage across the crystal.

In an attempt to reduce the errors caused by inaccurate clocking within mobile phones, conventional systems use mechanical or electrical capacitive trimmers to reduce the error of the real time clock. Generally, in these systems, a variable or trimmer capacitor is placed into the voltage supply of a crystal oscillator. The capacitor can be adjusted until the oscillator oscillates at a desired or preset frequency. However, setting the capacitor requires additional expense and time which is not optimal with mobile phones.

Additionally, attempts at overcoming the problems of fixed and dynamic errors associated with crystal oscillators have also included hardware and/or software compensation that is calibrated to an external high accuracy reference. For example, one possible solution would be to have a real time clock that is referenced to a high accuracy clock based upon an external timing reference (e.g., a timing reference located in a base station) during use of the mobile telephone. However, this type of system calibrates the accuracy periodically (i.e., only when the system is powered on by a user) through the use of a high accuracy clock at a base station and can produce inaccurate reference signals, due to the Doppler Effect, as the distance between the base station and mobile phone varies.

Finally, individual test devices that can attach to the mobile phone have also been developed. For example, U.S. Pat. No. 5,481,507 describes an electric timekeeping device that generates an adjustable time-based signal in an effort to reduce the data that needs to be stored. Adjustment data, that is applied to an oscillator clock signal, is stored in a non-volatile memory. The adjustment data allows the time-based signal to be adjusted once per time-based cycle. However, a peak value or frequency error is determined and used to update the time based signal at every clock cycle. Additionally, the adjustment equipment, including an adjustment data calculator, is external to the mobile phone which does not allow for maximum efficiency.

The solutions described above do not provide an increase in accuracy without additional problems. As a result, a method and an associated apparatus to economically and efficiently increase the accuracy of mobile telephone units is needed.

In accordance with an exemplary embodiment of the present invention methods and apparatuses for calibrating and correcting inaccuracies in a real time clock are provided.

In one aspect of the invention, a real time clock signal is generated by generating a high frequency clock signal; generating a low frequency clock signal from the high frequency clock signal; generating a corrected low frequency clock signal by adjusting a frequency of the low frequency clock signal once out of every $\text{Count}_{Adjust}$ assertions of the low frequency clock signal, wherein $Count_{Adjust}$ is an integer greater than one; and supplying the corrected low frequency clock signal as the real time clock signal.

In accordance with another aspect of the invention, the step of generating the corrected low frequency clock signal comprises the steps of counting assertions of the low frequency clock signal, thereby generating a present count value; comparing the present count value with the $Count_{Adjust}$; and adjusting the frequency of the low frequency clock signal in response to the present count value being equal to the $Count_{Adjust}$.

In yet another aspect of the invention, generating the low frequency clock signal from the high frequency clock signal comprises using a frequency divider to generate one assertion of the low frequency clock signal for every N assertions of the high frequency clock signal, wherein N is an integer greater than one. Furthermore, adjusting the frequency of the low frequency clock signal comprises adjusting N by an amount r, wherein r is an integer having a magnitude greater than or equal to one.

The high frequency clock signal may be generated from a higher frequency clock signal by using a second frequency divider to generate one assertion of the high frequency clock signal for every M assertions of the higher frequency clock signal, wherein M is an integer greater than one.

In yet another aspect of the invention, a value for $Count_{Adjust}$ is generated by performing a calibration process that includes the steps of counting assertions of a first oscillator signal from which the high frequency clock signal is derived; simultaneously counting assertions of a reference oscillator signal; determining a measured count value representing a number of assertions of the reference oscillator signal that occurred for a predetermined number of assertions of the first oscillator signal; generating an error count value by comparing the measured count value with an expected count value; and converting the error count value to the $Count_{Adjust}$.

In still another aspect of the invention, the step of converting the error count value to the $Count_{Adjust}$ comprises the step of computing:

$$Count_{Adjust} = \frac{r \times f_{ref} \times T_{measured}}{N \times |T_{measured} \times f_{ref} - Count_{measured}|}$$

wherein:
N is an integer that represents a ratio of frequencies of the high frequency clock signal and the low frequency clock signal;
$T_{measured}$ is a nominal interval of time required for the first oscillator signal to be asserted the predetermined number of times;
r is an integer amount by which N will be adjusted once out of every $Count_{Adjust}$ assertions of the low frequency clock;
$f_{ref}$ is a nominal frequency of the reference oscillator signal; and
$COUNT_{measured}$ is the measured count value.

When employed in an apparatus that may not always have power supplied to the real time clock, such as a mobile telephone, the value $Count_{Adjust}$ may be stored in a nonvolatile memory for use during operation of the apparatus.

BRIEF DESCRIPTION OF THE DRAWINGS

The foregoing and other objects, features and advantages of the present invention will be more readily understood upon reading the following detailed description in conjunction with the drawings in which.

DETAILED DESCRIPTION

In the following description, for purposes of explanation and not limitation, specific details are set forth, such as particular circuits, circuit components, techniques, and the like, in order to provide a thorough understanding of the present invention. However, it will be apparent to those skilled in the art that the present invention may be practiced in other embodiments that depart from these specific details. In other instances, detailed descriptions of well-known methods, devices and circuits are omitted so as not to obscure the description of the present invention with unnecessary detail.

Figure 1:
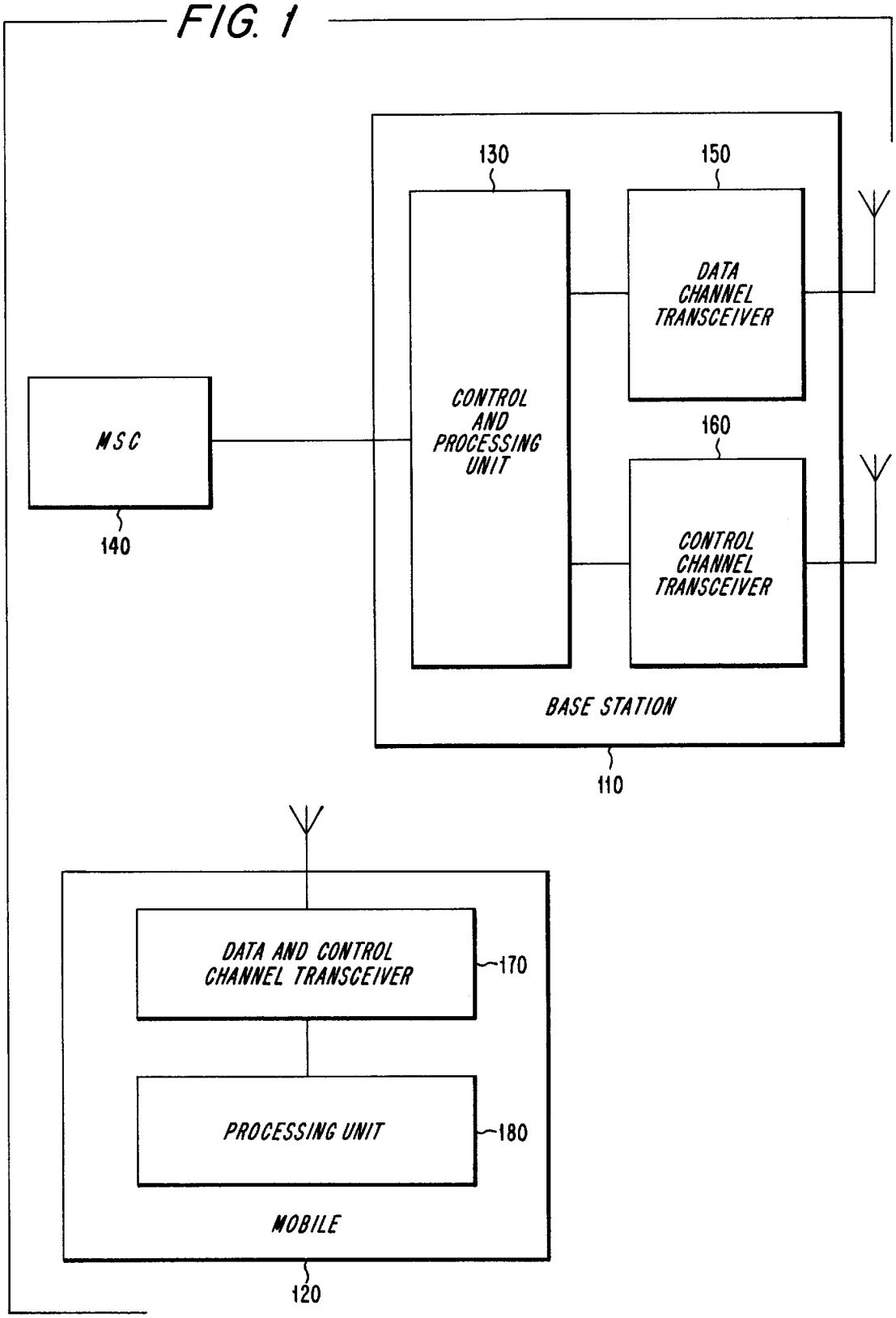
FIG. 1 illustrates a block diagram of a cellular mobile radiotelephone system.
Figure 2:
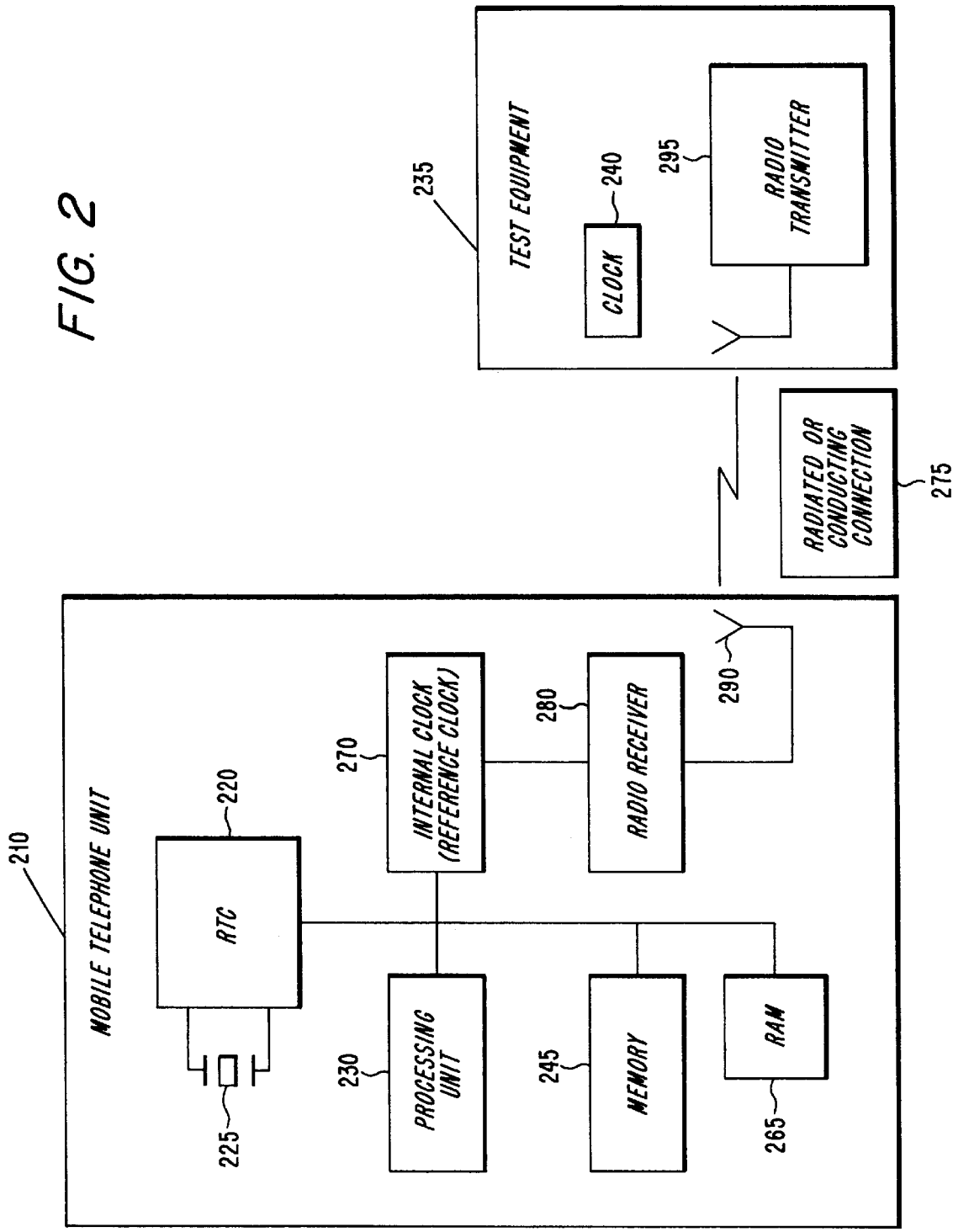
FIG. 2 illustrates a block diagram of a mobile telephone unit and associated testing equipment in accordance with an exemplary embodiment of the present invention.

FIG. 2 illustrates a block diagram of an exemplary mobile station configuration in which a mobile telephone unit 210 is provided with a real time clock (RTC) 220. The RTC 220 is a counter that counts the number of clock cycles generated by a crystal oscillator 225. The counted value is typically converted to seconds, minutes, hours and a date. A memory 245 is also located within the mobile telephone unit 210 and is able to store various system parameters and the like, and is preferably a non-volatile memory such as an EEPROM. A volatile memory, RAM 265, can also be employed within the mobile telephone unit and be used to store various testing procedures and diagnostic programs. Although different memories are shown, a single memory, which could be non-volatile, could instead be employed to store the various programs, system parameters and the like. As described above in the discussion of FIG. 1, processing unit 230 controls the various receive and transmit functions of the mobile station, among other processes.

In accordance with an exemplary embodiment of the present invention, the RTC 220 can be calibrated to an internal clock 270, having higher accuracy than the crystal oscillator 225, during production of the unit. If it is desired to even further increase the accuracy of the internal clock 270, it can communicate with test equipment 235 via a radio receiver 280 and antenna 290 for the purpose of performing a calibration procedure that will ultimately permit the RTC 220 to more accurately keep time despite inaccuracy in the timing signals generated by the crystal oscillator 225.

To ensure that the internal clock 270 is accurate, it can be calibrated (before calibration of the RTC 220) via a clock (not illustrated) located in the test equipment 235. Additionally, the internal clock 270 can also be synchronized to an even higher accuracy clock 240 located in test equipment 235. The synchronization can be performed via radio transmitter 295 or a conducting connection 275 (e.g., a cable connection).

In accordance with one aspect of the invention, the procedure to compensate for a fixed fault located in the crystal oscillator 225, in accordance with an exemplary embodiment of the present invention, is performed in three parts: a calibration phase, an initialization phase, and a correction phase.

Figure 3:
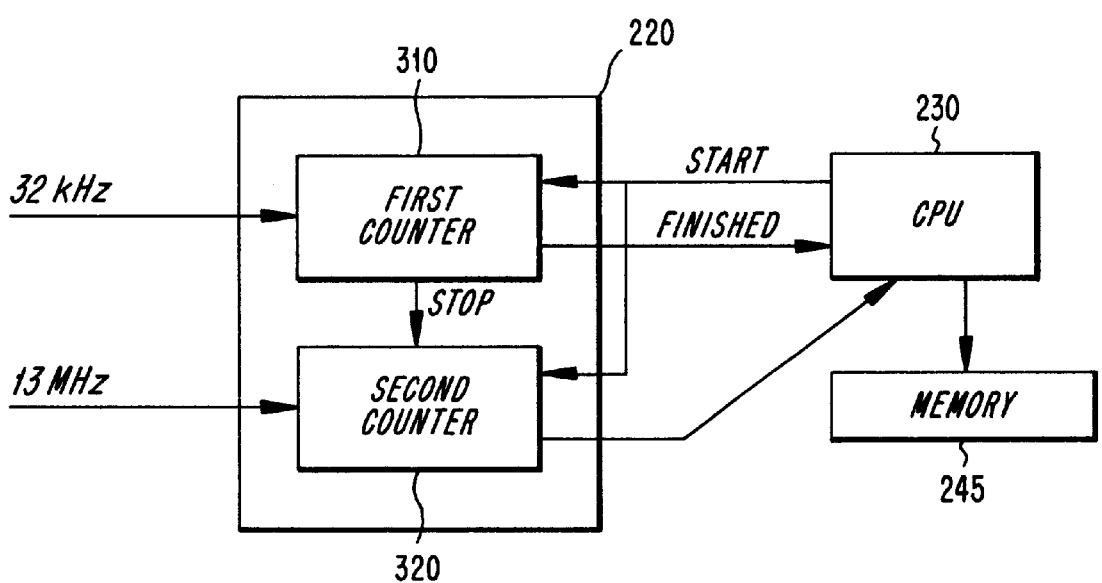
FIG. 3 illustrates a partial block diagram of the real time counter in accordance with an exemplary embodiment of the present invention.

The calibration phase of the compensation routine can be performed by testing the crystal oscillator 225 during the initial assembly of the mobile telephone unit 210. The elements of the RTC 220 that are pertinent to the calibration phase are illustrated in FIG. 3. The RTC 220 is able to use the timing pulses from the internal clock 270 to determine fixed faults associated with the crystal oscillator 225. The RTC 220, in accordance with an exemplary embodiment of the present invention, is driven by a 32.768 kHz crystal oscillator which, for matters of convenience, will be referred to herein as a 32 kHz crystal oscillator. However, it should be understood that, in alternative embodiments, other crystal oscillators characterized by different nominal operating frequencies could instead be employed.

A first counter 310, located in the RTC 220, counts the pulses output from the 32 kHz crystal oscillator. The crystal oscillator 225 should, in this example, generate 32,768 pulses every second. Additionally, a second counter 320 is provided for counting the number of timing pulses output from the internal clock 270. As described above, the internal clock 270 (for example 13 MHz in a GSM environment) is primarily used as the high frequency clock for running components within the mobile telephone unit 210. However, because of its high accuracy, it is being employed as a reference clock in this calibration process. It should be understood, however, that for purposes of calibration, other high accuracy clocks could instead be used as the reference clock. Such alternative reference clocks need not have nominal frequencies equal to 13 MHz. Furthermore, alternative reference clocks need not be located within the mobile telephone unit 210, but could instead be externally situated. For example, reference clocks could be located in test equipment 235, such as the high accuracy clock 240.

Upon command from the processing unit 230, the RTC 220 (or other calibration configuration) generates a count value representing a number of pulses generated by the reference clock which, in this exemplary embodiment, is the internal clock 270. The count value can be placed into memory 245 for later use in calculating a value that represents the length of time between corrections that are to be made to the real time clock 220 during normal operation of the mobile telephone unit 210.

In this aspect of the invention the inaccuracy of the RTC 220 is measured by running both the RTC 220 and the reference clock (e.g., the internal clock 270) for a same amount of time. The longer the measurement period, the more accurate the measured RTC inaccuracy. If the amount of time is established by running the RTC 220 for a predetermined number of cycles (which should correspond to an amount of time equal to the predetermined number of cycles divided by the nominal frequency of the RTC 220), then the difference between the measured count of the high accuracy clock and the predicted count (i.e., the amount of measurement time times the nominal frequency of the reference clock) is a measure of the inaccuracy associated with the RTC 220.

As an alternative embodiment of the present invention, one could establish the amount of time by running the reference clock (e.g., the internal clock 270) for a predetermined number of cycles. In this case, the error in the RTC 220 would be a difference between a measured RTC count value and a predicted RTC count value.

After obtaining a measure of the inaccuracy of the RTC 220, it is then possible to determine how often, during normal operation, a correction value should be applied to the RTC 220 in order to compensate for its inherent inaccuracy.

Figure 4:
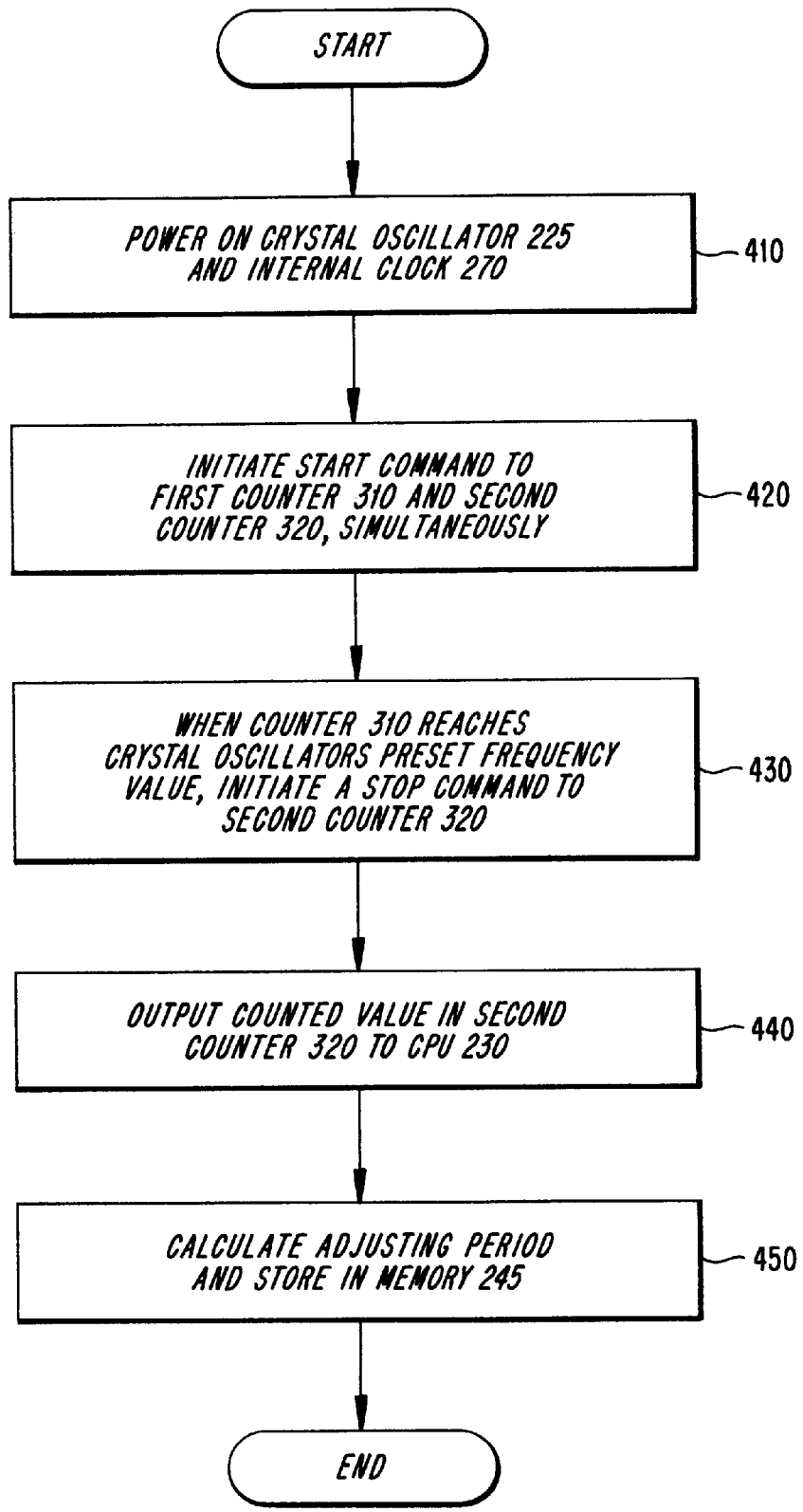
FIG. 4 illustrates a flow diagram of the calibration routine in accordance with an exemplary embodiment of the present invention.

Turning now to an exemplary embodiment, FIG. 4 illustrates the calibration phase of the correction routine. Here, it is desired to use the RTC 220 to count for a number of cycles that should (but may not, due to inaccuracy) correspond to a nominal measurement time period, Tmeasured, equal to, for example, one second of time. In order to obtain accurate measurements, it is preferable for both the crystal oscillator 225 and the reference clock (internal clock 270) to be initially turned on and permitted to run for a suitable warm-up period (step 410). When both clocks are stable, the calibration procedure continues.

In step 420, the processing unit 230, running a test program stored in RAM 265, initiates a start command (see FIG. 3) to the first counter 310 of the RTC 220 to count 32768 cycles from the 32 kHz crystal. It should be noted that the RTC 220 can also be programmed to count different numbers of cycles if the crystal oscillator employed within the mobile phone has a different nominal frequency or if the nominal testing period is other than one second. The second counter 320 of RTC 220 is simultaneously commanded to begin counting the number of cycles (i.e., clock pulses) generated by the reference clock (internal clock 270) during the same time period.

In step 430, when the first counter 310 reaches the number of cycles that should correspond to one second of counting (i.e., 32,768 in the exemplary embodiment), it outputs a stop signal to the second counter 320. If the second counter 320 has counted fewer than 13,000,000 cycles, it means that the crystal oscillator 225 is faster than its desired nominal frequency. Similarly, if the second counter 320 counts more than 13,000,000 cycles it means that the crystal oscillator 225 is slower than its desired nominal frequency. The second counter 320, without any error in the crystal oscillator 225, should count 13,000,000 system clock cycles. In step 440, a value representative of the inaccuracy of the RTC 220 is supplied to CPU 230. This value may be the number of clock pulses counted by the second counter 320. Alternatively, the number of system clock pulses can be converted to another value (e.g., by subtracting it from an expected count value).

In step 450, the measured count of reference clock pulses (herein denoted $Count_{measured}$) is used to derive an Adjusting Period value that represents an interval of time between correcting time adjustments that are made to the RTC 220. The value of the second counter 320 (which supplies the $Count_{measured}$ value) is preferably a 24 bit value. The accuracy of $Count_{measured}$ is +/−1 bit.

Figure 5:
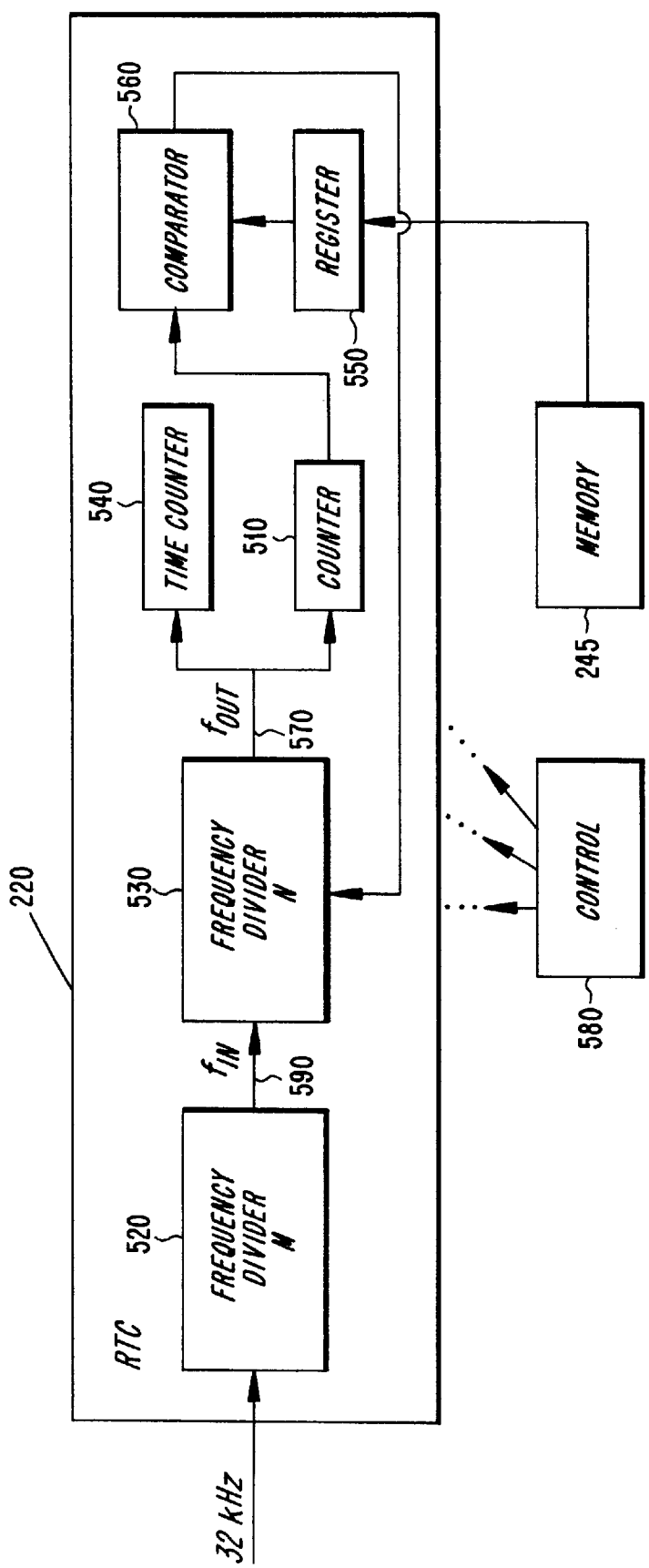
FIG. 5 illustrates a partial block diagram of real time counter in accordance with an exemplary embodiment of the present invention.

In the exemplary embodiment, the RTC 220 includes one or more frequency dividers for down-converting the frequency of the crystal oscillator signal to a frequency suitable for clocking a time counter. FIG. 5 illustrates one such example. A 32 kHz is supplied to a first frequency divider 520 that generates a lower frequency signal that is supplied to a second frequency divider 530. The output of the second frequency divider 530 is supplied to a clocking input of a time counter 540. Assuming that the first frequency divider 520 divides by a value M, and that the second frequency divider divides by a value N, the frequency ($f_{out}$) of the signal supplied by the second frequency divider 530 is 32 kHz/(M×N). Timing adjustments can conveniently be made in this configuration by adjusting either division factor, M or N. For example, letting $f_{in}$ denote the frequency of the signal 590 supplied to the second frequency divider 530, it follows that adjusting the value of N by ±1 will respectively advance or delay the output of the frequency divider by an amount equal to $1/f_{in}$. Because this signal 570 is used to clock the time counter 540, the accuracy of the time counter 540 is affected accordingly.

It will be understood, then, that the purpose of the calculation performed in step 450 (see FIG. 4) is to determine an appropriate interval of time (herein denoted $T_{Adjusting\ Period}$) at which such adjustments should be made in order to compensate for the inaccuracy of the crystal oscillator signal. To determine the $T_{Adjusting\ Period}$, one first determines the amount of measured clock error. One measure, denoted herein as $Count_{error}$, represents this error in units of reference clock cycles. It is determined in accordance with:

$$Count_{error} = Count_{expected} - Count_{measured} T_{measured} \times f_{ref} - Count_{measured} \quad (1)$$

where:

$f_{ref}$ is the frequency of the reference clock (e.g., internal clock 270); and $T_{measured}$ is the nominal duration of the measurement interval. It will be observed that $Count_{error}$ will be a positive value when the crystal oscillator 225 is running fast. In this case, the necessary adjustment will involve increasing the division factor, N, for a cycle in order to delay the occurrence of a clocking signal 570 being supplied to the time counter 540. Similarly, Counterror is a negative value when the crystal oscillator 225 is running slow. In this case, the necessary adjustment will involve reducing the division factor, N, for a cycle in order to hasten the occurrence of a clocking signal 570 being supplied to the time counter 540.

The amount of the error can then be expressed in units of time in accordance with:

$$T_{error} = \frac{Count_{error}}{f_{ref}}. \quad (2)$$

$T_{error}$ represents the amount of error introduced during the measurement interval, $T_{measured}$. The rate of error introduction into the RTC 220 can then simply be determined as:

$$Rate_{error} = \frac{T_{error}}{T_{measured}}. \quad (3)$$

Having determined the rate at which the crystal oscillator 225 introduces an error into the RTC 220, one next determines the amount by which the clocking of the time counter 540 will be appropriately advanced or delayed in order to compensate for the error. As explained earlier, embodiments that utilize one or more frequency dividers to convert the relatively high speed crystal oscillator signal to a slower clocking signal (for use by a time counter) permit advancing or delaying adjustments to be made by respectively reducing or increasing a division factor that controls one of the frequency dividers. Thus, in the exemplary embodiment, it will be desired to periodically adjust the value N (the division factor of the second frequency divider 530) by an amount equal to ±r (where r is an integer greater than or equal to 1), thereby achieving a correcting delay or advancement of the clocking signal 570 by an amount equal to $r/f_{in}$. In a preferred embodiment, r=1.

The interval, $T_{Adjusting\ Period}$ at which these adjustments should be made is found in accordance with:

$$T_{Adjusting\ Interval} = (Granularity\ of\ Correction) \times \frac{1}{Rate_{error}} \quad (4)$$

$$= \frac{r}{f_{in}} \times \frac{f_{ref} \times T_{measured}}{|Count_{error}|}.$$

The reason for using the absolute value of $Count_{error}$ in the above equation is because it is necessary for the interval $T_{Adjusting\ Period}$ to be a positive value. The sign of $Count_{error}$ is accounted for in determining whether to increment or decrement the division factor N, as described above.

Recognizing that $f_{in} = N \times f_{out}$, and substituting the right side of Eq. (1) for $Count_{error}$, we obtain:

$$T_{Adjusting\ Period} = \frac{r}{f_{in}} \times \frac{f_{ref} \times T_{measured}}{|Count_{error}|} \quad (5)$$

$$= \frac{r}{N \times f_{out}} \times \frac{f_{ref} \times T_{measured}}{|T_{measured} \times f_{ref} - Count_{measured}|}$$

$$= \frac{r \times f_{ref} \times T_{measured}}{N \times f_{out} \times |T_{measured} \times f_{ref} - Count_{measured}|}.$$

In embodiments such as the one shown in FIG. 5, the interval $T_{Adjusting\ Period}$ is determined by counting a corresponding number of cycles (herein denoted $Count_{Adjust}$) of the clocking signal 570. In this case, $Count_{Adjust}$ is determined in accordance with:

$$Count_{Adjust} = T_{adjusting\ Period} \times f_{out} \quad (6)$$

$$= \frac{r \times f_{ref} \times T_{measured} \times f_{out}}{N \times f_{out} \times |T_{measured} \times f_{ref} - Count_{measured}|}$$

$$= \frac{r \times f_{ref} \times T_{measured}}{N \times |T_{measured} \times f_{ref} - Count_{measured}|}$$

It will be observed that if N and M are selected so as to generate a clocking signal 570 having a nominal frequency of $f_{out}=1$ Hz, and if the nominal measurement period $T_{measured}$, is selected to be 1 second, then Eq.(6) reduces to:

$$Count_{Adjust} = \frac{r \times f_{ref}}{N \times |f_{ref} - Count_{measured}|}. \quad (7)$$

As an illustrative example, consider an embodiment in which N=128, $f_{ref}$=13 MHZ, and $Count_{measured}$=12,999,500. In this case, we find that the crystal oscillator 225 is fast (the reference clock stopped counting too soon), so the amount of adjustment will be r=1. Furthermore, these adjustments must be made once every $T_{Adjusting\ Period}$=203.125 seconds (rounded to a value of 203). It is found that $Count_{Adjust}$ also has a rounded value of 203. This is not surprising, since the 1 Hz frequency of the clocking signal 570 means that there is a corresponding count for each second that we must wait.

In preferred embodiments, values for $Count_{Adjust}$ are represented by 15 bit values. A sign bit is also stored so that the appropriate adjustment (i.e., addition or subtraction) can be made to the division factor N.

Figure 6:
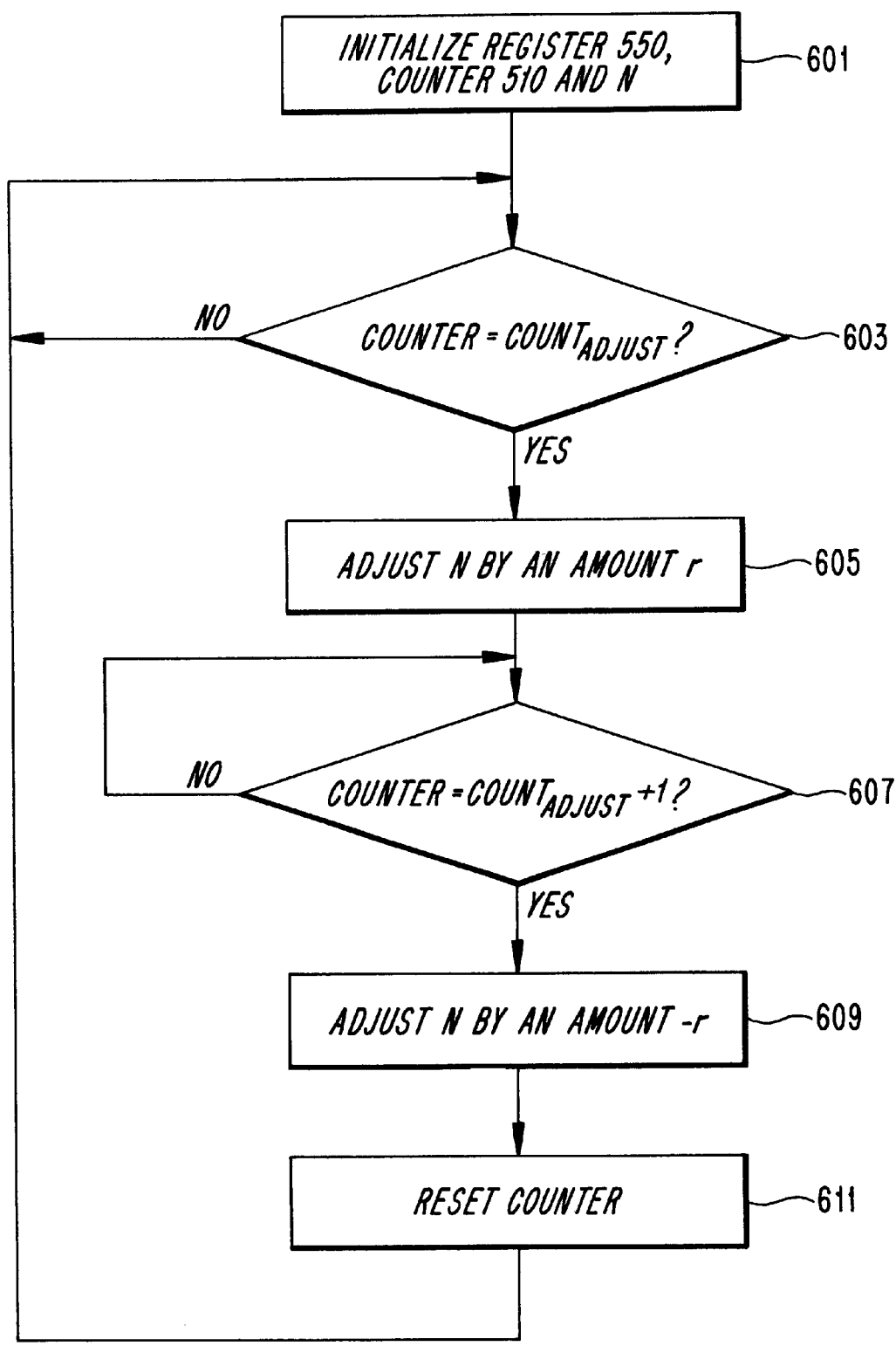
FIG. 6 is a flow chart depicting steps performed as part of initialization and correction phases of a real time clock correction technique in accordance with one aspect of the invention.

Thus, at the conclusion of the calibration phase, values for r and $Count_{Adjust}$ are known. These values are applied during the normal operation of the RTC 220. Those elements of the RTC 220 that are pertinent to the initialization and correction phases of the correction routine will now be described with reference again being made to FIG. 5, and also to the flow chart of FIG. 6. The various steps described herein are carried out by a control unit 580, which may be embodied in any of a number of ways. For example, it may be a hard-wired logic controller. Alternatively, the control unit 580 may be a programmable processor executing a suitable set of program instructions. The invention may also be considered to be embodied in a computer readable storage medium having stored therein signals representative of the program instructions for carrying out the various steps described in this disclosure. Computer readable storage media include, but are not limited to magnetic storage media, such as magnetic disk or tape; and optical storage media, such as Compact Disk (CD) Read Only Memory (ROM) devices.

The initialization phase of the correction routine is performed whenever the phone is activated. As part of initialization (step 601), the operating system of the mobile telephone unit 210 copies the $Count_{Adjust}$ value from the memory 245 to a memory, which in the exemplary embodiment is a volatile memory such as a register 550, located in the RTC 220. This will ensure that the RTC 220 uses the correct value even if all power to the RTC 220 had been previously lost (i.e., in the event that a power back-up capacitor associated with the crystal oscillator 225 had been completely discharged).

In accordance with the present invention, a counter 510 is provided in the RTC 220 for counting the number of assertions of the clocking signal 570 that have occurred since the last correction. The value output by the counter 510 is compared, by a comparator 560, with the value stored in the register 550. When the counter 510 has reached the same value as the value stored in the register 550 ("YES" path out of decision block 603), an output signal from the comparator 560 is asserted, thereby causing the control unit 580 to adjust the value of N by an amount r (step 605). This is depicted schematically in FIG. 5 by the line connecting the output of the comparator 560 to an input of the second frequency divider 530. As explained earlier, adjusting the value of N in this manner causes the clocking signal 570 to be delayed or advanced by an amount r multiplied by the period of signal 590 being applied at the input of the second frequency divider 530. The purpose of this adjustment is to compensate for the inaccuracy of the 32 kHz crystal oscillator 225.

It is only desired to perform this correction once for every $Count_{Adjust}$ assertions of the clocking signal 570. Accordingly, the control unit 580 monitors the value in the counter 510 until it is further advanced to a value of $Count_{Adjust}+1$ (decision block 607). When this occurs, the value of N is adjusted back to its original value (step 609), and the counter 510 is reset (step 611). The correction procedure is then repeated, beginning back at step 603. In this manner, the period between successive assertions of the clocking signal 570 will be increased or decreased by an amount equal to $r/f_{in}$ once for every $Count_{Adjust}$ non-adjusted assertions.

The accuracy of the adjusted RTC time counter is dependent on the accuracy of the high frequency clock (e.g., a 13 MHz clock). This technique disclosed herein reduces the fixed fault to less than 1 ppm (assuming that the accuracy of the high accuracy clock is better than 1 ppm) resulting in better accuracy of the RTC 220 in the mobile station at almost no cost. No extra equipment in the test environment is needed. Also, no extra time in production is needed. The calibration step can be performed simultaneously with other tests and there is no need for external control of the testing.

While the present invention has been described with respect to its preferred embodiments, those skilled in the art will recognize that the present invention is not limited to the specific embodiment described and illustrated herein. For example, although the exemplary embodiments utilize two frequency dividers 520 and 530, alternative embodiments could utilize fewer (i.e., one) or more frequency dividers for the purpose of converting the frequency of the crystal oscillator signal to the desired frequency of the clocking signal 570.

Accordingly, different embodiments and adaptations besides those shown herein and described as well as many variations, modifications and equivalent arrangements will now be apparent or will be reasonably suggested by the foregoing specification and drawings without departing from the substance of the scope of the invention.

What is claimed is:

1. A method of generating a real time clock signal, comprising the steps of:
   generating a high frequency clock signal;
   generating a low frequency clock signal from the high frequency clock signal;
   generating a corrected low frequency clock signal by adjusting a frequency of the low frequency clock signal by a predefined amount, r, once out of every $Count_{Adjust}$ assertions of the low frequency clock signal, wherein $Count_{Adjust}$ is an integer greater than one that is calculated as a function of r; and
   supplying the corrected low frequency clock signal as the real time clock signal.

2. The method of claim 1, wherein the step of generating the corrected low frequency clock signal comprises the steps of:
   counting assertions of the low frequency clock signal, thereby generating a present count value;
   comparing the present count value with the $Count_{Adjust}$; and
   adjusting the frequency of the low frequency clock signal in response to the present count value being equal to the $Count_{Adjust}$.

3. The method of claim 2, wherein:
   the step of generating the low frequency clock signal from the high frequency clock signal comprises the step of using a frequency divider to generate one assertion of the low frequency clock signal for every N assertions of the high frequency clock signal, wherein N is an integer greater than one; and
   the step of adjusting the frequency of the low frequency clock signal comprises the step of adjusting N by an amount r, wherein r is an integer having a magnitude greater than or equal to one.

4. The method of claim 3, further comprising the step of:
   generating the high frequency clock signal from a higher frequency clock signal by using a second frequency divider to generate one assertion of the high frequency clock signal for every M assertions of the higher frequency clock signal, wherein M is an integer greater than one.

5. The method of claim 1, further comprising:
   deriving the high frequency clock signal from a signal generated by a crystal oscillator.

6. The method of claim 1, further comprising the steps of:
   generating $Count_{Adjust}$ by performing a calibration process that includes the steps of:
   counting assertions of a first oscillator signal from which the high frequency clock signal is derived;

simultaneously counting assertions of a reference oscillator signal;

determining a measured count value representing a number of assertions of the reference oscillator signal that occurred for a predetermined number of assertions of the first oscillator signal;

generating an error count value by comparing the measured count value with an expected count value; and converting the error count value to the $Count_{Adjust}$.

7. The method of claim 6, wherein the step of converting the error count value to the $Count_{Adjust}$ comprises the step of computing:

$$Count_{Adjust} = \frac{r \times f_{ref} \times T_{measured}}{N \times |T_{measured} \times f_{ref} - Count_{measured}|}$$

wherein:

N is an integer that represents a ratio of frequencies of the high frequency clock signal and the low frequency clock signal;

$T_{measured}$ is a nominal interval of time required for the first oscillator signal to be asserted the predetermined number of times;

r is an integer amount by which N will be adjusted once out of every $Count_{Adjust}$ assertions of the low frequency clock;

$f_{ref}$ is a nominal frequency of the reference oscillator signal; and $Count_{measured}$ is the measured count value.

8. The method of claim 1, wherein the low frequency clock signal is a 1 Hz signal.

9. The method of claim 1, further comprising the step of supplying the real time clock signal for use in a mobile terminal.

10. A method of determining an amount $Count_{Adjust}$ for use in an apparatus that generates a low frequency clock signal from a high frequency clock signal, and generates a corrected low frequency clock signal by adjusting a frequency of the low frequency clock signal once out of every $Count_{Adjust}$ assertions of the low frequency clock signal, wherein $Count_{Adjust}$ is an integer greater than one, the method comprising the steps of:

counting assertions of a first oscillator signal from which the high frequency clock signal is derived;

simultaneously counting assertions of a reference oscillator signal;

determining a measured count value representing a number of assertions of the reference oscillator signal that occurred for a predetermined number of assertions of the first oscillator signal;

generating an error count value by comparing the measured count value with an expected count value; and converting the error count value to the $Count_{Adjust}$.

11. The method of claim 10, wherein the step of converting the error count value to the $Count_{Adjust}$ comprises the step of computing:

$$Count_{Adjust} = \frac{r \times f_{ref} \times T_{measured}}{N \times |T_{measured} \times f_{ref} - Count_{measured}|}$$

wherein:

N is an integer that represents a ratio of frequencies of the high frequency clock signal and the low frequency clock signal;

$T_{measured}$ is a nominal interval of time required for the first oscillator signal to be asserted the predetermined number of times;

r is an integer amount by which N will be adjusted once out of every $Count_{Adjust}$ assertions of the low frequency clock;

$f_{ref}$ is a nominal frequency of the reference oscillator signal; and $Count_{measured}$ is the measured count value.

12. The method of claim 10, further comprising the step of storing $Count_{Adjust}$ in a nonvolatile memory for use during operation of the apparatus.

13. A real time clock generator, comprising:

a frequency divider for generating a low frequency clock signal from a high frequency clock signal; and means for generating a corrected low frequency clock signal by adjusting a frequency of the low frequency clock signal by a predefined amount, r, once out of every $Count_{Adjust}$ assertions of the low frequency clock signal, wherein $Count_{Adjust}$ is an integer greater than one that is calculated as a function of r.

14. The real time clock generator of claim 13, wherein the means for generating the corrected low frequency clock signal comprises:

a counter for counting assertions of the low frequency clock signal, thereby generating a present count value;

a comparator for comparing the present count value with the $Count_{Adjust}$; and an adjustment unit for adjusting the frequency of the low frequency clock signal in response to the present count value being equal to the $Count_{Adjust}$.

15. The real time clock generator of claim 14, wherein:

the means for generating the low frequency clock signal from the high frequency clock signal comprises a frequency divider that generates one assertion of the low frequency clock signal for every N assertions of the high frequency clock signal, wherein N is an integer greater than one; and the adjustment unit for adjusting the frequency of the low frequency clock signal comprises an adjustment unit that adjusts N by an amount r, wherein r is an integer having a magnitude greater than or equal to one.

16. The real time clock generator of claim 15, further comprising:

a second frequency divider that generate one assertion of the high frequency clock signal for every M assertions of a higher frequency clock signal, wherein M is an integer greater than one.

17. The real time clock generator of claim 13, further comprising:

a crystal oscillator for generating a crystal oscillator signal from which the high frequency clock signal is derived.

18. The real time clock generator of claim 13, further comprising:

calibration components for generating $Count_{Adjust}$, comprising:

a first counter for counting assertions of a first oscillator signal from which the high frequency clock signal is derived;

a second counter for simultaneously counting assertions of a reference oscillator signal;

means for determining a measured count value representing a number of assertions of the reference oscillator signal that occurred for a predetermined number of assertions of the first oscillator signal;

a comparator for comparing the measured count value with an expected count value, thereby generating an error count value; and means for converting the error count value to the $\text{Count}_{Adjust}$.

19. The real time clock generator of claim 18, wherein the means for converting the error count value to the $\text{Count}_{Adjust}$ comprises means for computing:

$$\text{Count}_{Adjust} = \frac{r \times f_{ref} \times T_{measured}}{N \times |T_{measured} \times f_{ref} - \text{Count}_{measured}|}$$

wherein:

N is an integer that represents a ratio of frequencies of the high frequency clock signal and the low frequency clock signal;

$T_{measured}$ is a nominal interval of time required for the first oscillator signal to be asserted the predetermined number of times;

r is an integer amount by which N will be adjusted once out of every $\text{Count}_{Adjust}$ assertions of the low frequency clock;

$f_{ref}$ is a nominal frequency of the reference oscillator signal; and $\text{Count}_{measured}$ is the measured count value.

20. The real time clock generator of claim 13, wherein the low frequency clock signal is a 1 Hz signal.

21. The real time clock generator of claim 13, further comprising means for supplying the real time clock signal to at least one component in a mobile terminal.

22. A calibration unit for determining an amount $\text{Count}_{Adjust}$ for use in an apparatus that generates a low frequency clock signal from a high frequency clock signal, and generates a corrected low frequency clock signal by adjusting a frequency of the low frequency clock signal once out of every $\text{Count}_{Adjust}$ assertions of the low frequency clock signal, wherein $\text{Count}_{Adjust}$ is an integer greater than one, the calibration unit comprising:

a first counter for counting assertions of a first oscillator signal from which the high frequency clock signal is derived;

a second counter for simultaneously counting assertions of a reference oscillator signal;

means for determining a measured count value representing a number of assertions of the reference oscillator signal that occurred for a predetermined number of assertions of the first oscillator signal;

a comparator for generating an error count value by comparing the measured count value with an expected count value; and means for converting the error count value to the $\text{Count}_{Adjust}$.

23. The calibration unit of claim 22, wherein the means for converting the error count value to the $\text{Count}_{Adjust}$ comprises means for computing:

$$\text{Count}_{Adjust} = \frac{r \times f_{ref} \times T_{measured}}{N \times |T_{measured} \times f_{ref} - \text{Count}_{measured}|}$$

wherein:

N is an integer that represents a ratio of frequencies of the high frequency clock signal and the low frequency clock signal;

$T_{measured}$ is a nominal interval of time required for the first oscillator signal to be asserted the predetermined number of times;

r is an integer amount by which N will be adjusted once out of every $\text{Count}_{Adjust}$ assertions of the low frequency clock;

$f_{ref}$ is a nominal frequency of the reference oscillator signal; and $\text{Count}_{measured}$ is the measured count value.

24. The calibration unit of claim 22, further comprising a nonvolatile memory for storing $\text{Count}_{Adjust}$ for use during operation of the apparatus.

25. A mobile unit for use in a radiocommunication system, the mobile unit comprising:

a controller for controlling components in the mobile unit; and a real time clock generator, comprising:
a frequency divider for generating a low frequency clock signal from a high frequency clock signal; and
means for generating a corrected low frequency clock signal by adjusting a frequency of the low frequency clock signal once out of every $\text{Count}_{Adjust}$ assertions of the low frequency clock signal, wherein $\text{Count}_{Adjust}$ is an integer greater than one.

26. The mobile unit of claim 25, wherein the means for generating the corrected low frequency clock signal comprises:

a counter for counting assertions of the low frequency clock signal, thereby generating a present count value;

a comparator for comparing the present count value with the $\text{Count}_{Adjust}$; and an adjustment unit for adjusting the frequency of the low frequency clock signal in response to the present count value being equal to the $\text{Count}_{Adjust}$.

27. The mobile unit of claim 26, wherein:

the means for generating the low frequency clock signal from the high frequency clock signal comprises a frequency divider that generates one assertion of the low frequency clock signal for every N assertions of the high frequency clock signal, wherein N is an integer greater than one; and the adjustment unit for adjusting the frequency of the low frequency clock signal comprises an adjustment unit that adjusts N by an amount r, wherein r is an integer having a magnitude greater than or equal to one.

28. The mobile unit of claim 27, wherein the real time clock generator further comprises:

a second frequency divider that generate one assertion of the high frequency clock signal for every M assertions of a higher frequency clock signal, wherein M is an integer greater than one.

29. The mobile unit of claim 25, further comprising:

a crystal oscillator for generating a crystal oscillator signal from which the high frequency clock signal is derived.

30. The mobile unit of claim 25, further comprising:

calibration components for generating $\text{Count}_{Adjust}$, comprising:

a first counter for counting assertions of a first oscillator signal from which the high frequency clock signal is derived;

a second counter for simultaneously counting assertions of a reference oscillator signal;

means for determining a measured count value representing a number of assertions of the reference oscillator signal that occurred for a predetermined number of assertions of the first oscillator signal;

a comparator for comparing the measured count value with an expected count value, thereby generating an error count value; and means for converting the error count value to the $Count_{Adjust}$.

31. The mobile unit of claim 30, wherein the means for converting the error count value to the $Count_{Adjust}$ comprises means for computing:

$$Count_{Adjust} = \frac{r \times f_{ref} \times T_{measured}}{N \times |T_{measured} \times f_{ref} - Count_{measured}|}$$

wherein:

N is an integer that represents a ratio of frequencies of the high frequency clock signal and the low frequency clock signal;

$T_{measured}$ is a nominal interval of time required for the first oscillator signal to be asserted the predetermined number of times;

r is an integer amount by which N will be adjusted once out of every $Count_{Adjust}$ assertions of the low frequency clock;

$f_{ref}$ is a nominal frequency of the reference oscillator signal; and $Count_{measured}$ is the measured count value.

32. The mobile unit of claim 25, wherein the low frequency clock signal is a 1 Hz signal.

33. The mobile unit of claim 25, further comprising a calibration unit for determining $Count_{Adjust}$.

34. The mobile unit of claim 33, wherein the calibration unit comprises:

a first counter for counting assertions of a first oscillator signal from which the high frequency clock signal is derived;

a second counter for simultaneously counting assertions of a reference oscillator signal;

means for determining a measured count value representing a number of assertions of the reference oscillator signal that occurred for a predetermined number of assertions of the first oscillator signal;

a comparator for generating an error count value by comparing the measured count value with an expected count value; and means for converting the error count value to the $Count_{Adjust}$.

35. The mobile terminal of claim 34, further comprising:

a reference clock generator for generating the reference oscillator signal.

36. The mobile terminal of claim 35 wherein the reference clock generator is synchronized to a higher accuracy clock that is external to the mobile terminal.

37. The mobile terminal of claim 35, further comprising wireless means for coupling the reference clock generator and the higher accuracy clock.

38. The mobile terminal of claim 35, further comprising a wire connection for coupling the reference clock generator and the higher accuracy clock.

39. The mobile terminal of claim 34, wherein the reference oscillator signal is supplied by a reference clock generator that is located external to the mobile terminal.

* * * * *